United States Patent
Bottini et al.

(10) Patent No.: US 6,548,354 B2
(45) Date of Patent: Apr. 15, 2003

(54) PROCESS FOR PRODUCING A SEMICONDUCTOR MEMORY DEVICE COMPRISING MASS-STORAGE MEMORY CELLS AND SHIELDED MEMORY CELLS FOR STORING RESERVED INFORMATION

(75) Inventors: Roberta Bottini, Lissone (IT); Giovanna Dalla Libera, Monza (IT); Bruno Vajana, Bergamo (IT); Federico Pio, Brugherio (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/796,757

(22) Filed: Feb. 28, 2001

(65) Prior Publication Data

US 2001/0025980 A1 Oct. 4, 2001

Related U.S. Application Data (62) Division of application No. 09/109,108, filed on Jul. 2, 1998, now abandoned.

(30) Foreign Application Priority Data

Jul. 3, 1997 (EP) ............................................. 97830334

(51) Int. Cl.⁷ ............................................ H01L 21/336
(52) U.S. Cl. ....................... 438/258; 438/241; 438/314; 438/257; 438/266; 438/201; 438/211
(58) Field of Search ................................. 438/314, 315, 438/316, 257, 263, 265, 48, 258, 264, 266, 275, 241, 201, 211

(56) References Cited

U.S. PATENT DOCUMENTS

| | | | |
|---|---|---|---|
| 4,417,325 A | * 11/1983 | Harari | 365/185 |
| 4,970,565 A | 11/1990 | Wu et al. | 357/23.5 |
| 5,068,697 A | 11/1991 | Noda et al. | 357/23.5 |
| 5,550,072 A | * 8/1996 | Cacharelis et al. | 437/43 |
| 5,635,416 A | * 6/1997 | Chen et al. | 438/258 |
| 5,650,346 A | * 7/1997 | Pan et al. | 437/43 |
| 5,789,294 A | * 8/1998 | Choi | 438/258 |
| 5,817,556 A | * 10/1998 | Sasaki | 438/257 |
| 5,888,869 A | * 3/1999 | Cho et al. | 438/258 |
| 6,020,229 A | * 2/2000 | Yamane et al. | 438/201 |

FOREIGN PATENT DOCUMENTS

| | | |
|---|---|---|
| EP | 0 357 333 A3 | 3/1990 |
| EP | 0 357 333 A2 | 3/1990 |
| JP | 7-130893 | 5/1995 |

\* cited by examiner

*Primary Examiner*—Amir Zarabian
*Assistant Examiner*—Khanh B. Duong
(74) *Attorney, Agent, or Firm*—Lisa K. Jorgenson; Robert Iannucci; Seed IP Law Group PLLC (57) ABSTRACT

A process for manufacturing a semiconductor memory device includes double polysilicon level non-volatile memory cells and shielded single polysilicon level non-volatile memory cells in the same semiconductor material chip. A first memory cell includes a MOS transistor having a first gate electrode and a second gate electrode superimposed and respectively formed by definition in a first and a second layer of conductive material. A second memory cell is shielded by a layer of shielding material for preventing the information stored in the second memory cell from being accessible from the outside. The second memory cell includes a MOS transistor with a floating gate electrode formed simultaneously with the first gate electrode of the first cell by definition of the first layer of conductive material. The layer of shielding material is formed by definition of the second layer of conductive material.

22 Claims, 6 Drawing Sheets

PROCESS FOR PRODUCING A SEMICONDUCTOR MEMORY DEVICE COMPRISING MASS-STORAGE MEMORY CELLS AND SHIELDED MEMORY CELLS FOR STORING RESERVED INFORMATION

CROSS-REFERENCE TO RELATED APPLICATION

This application is a divisional of U.S. application Ser. No. 09/109,108, filed Jul. 2, 1998, now abandoned.

TECHNICAL FIELD

The present invention relates to a process for producing a semiconductor memory device comprising mass-storage memory cells and shielded memory cells for storing reserved information.

BACKGROUND OF THE INVENTION

To increase the security of the stored information, it is known to protect at least some of the data stored within cells of a semiconductor memory from easy outside accessibility. This is, for example, the case of memories embedded in Smart Cards or other memory devices containing data for limited access. Therefore, it is necessary to provide suitable shielding layers to protect the data from being read, modified, or erased.

In particular, as far as electrically programmable non-volatile semiconductor memory devices such as EPROM, Flash EEPROM or EEPROM devices, shielding of the memory matrix, or of a portion thereof wherein reserved information is to be stored is conventionally generally obtained by forming a metal layer over the surface to be shielded, to prevent intrusion from the outside. Such metal layer is an additional metal layer other than those necessary to form interconnections, and significantly increases the cost and the manufacturing time of memory devices.

It is also known that electrically programmable non-volatile semiconductor memory cells such as EPROM, Flash EEPROM and EEPROM cells can be formed with a single level of polysilicon (SP) or with a double level of polysilicon (DP).

An example of single-polysilicon level electrically programmable non-volatile memory cells are single-polysilicon level FLOTOX EEPROM memory cells comprising a sensing transistor with a floating gate and a selection transistor for selecting the cell to be programmed in a group of cells of a matrix. The floating gate is capacitively coupled to an N+ diffusion forming the control gate of the sensing transistor. The floating gate of the sensing transistor and the gate of the selection transistor are formed in a same, unique layer of polysilicon. The cell also comprises, in a portion of its area, a tunnel oxide between the floating gate and the drain of the sensing transistor, wherein the passage of electrons during write and erase operations of the cell.

An example of single-polysilicon level EEPROM cell is provided in the U.S. Pat. No. 5,307,312 assigned to SGS-Thomson Microelectronics S.r.l., whose content is incorporated herein by reference.

An example of double-polysilicon level electrically programmable non-volatile memory cells are double-polysilicon level FLOTOX EEPROM memory cells, well known to the skilled person, comprising a floating gate transistor and a selection transistor for selecting the cell to be programmed inside a group of cells of a matrix. The gate of the transistor comprises a floating gate over which a control gate is insulatively disposed, with the interposition of a layer of oxide. The two gates are respectively formed in two different layers of polysilicon.

Single-polysilicon level cells have the advantage that they can be fabricated by means of simpler process steps with respect to double-polysilicon level ones, but for a same technological resolution they occupy an area at least twice that of the double-polysilicon level cells. They require more area because the single-polysilicon level cells are to be formed with the control gate and the floating gate one beside the other, instead of superimposed. It is apparent that double-polysilicon level cells are more suitable for applications where high integration degrees are desirable.

SUMMARY OF THE INVENTION

An object of the present invention is to provide a process for producing a semiconductor memory device comprising storage memory cells and shielded memory cells for preventing reading from the outside of information contained therein, said process not affected by the drawbacks of the known processes.

According to an embodiment of the present invention, such object is achieved by means of a process for manufacturing a semiconductor memory device comprising the formation, in a same semiconductor material chip, of at least a first memory cell comprising a MOS transistor with a first gate electrode and a second gate electrode superimposed and respectively formed by definition in a first and a second layer of conductive material, and of at least a second memory cell shielded by a layer of shielding material for preventing the information stored in the second memory cell from being accessible from the outside. The second memory cell comprises a MOS transistor with a floating gate electrode formed simultaneously with the first gate electrode of the first cell by definition of said first layer of conductive material, and the layer of shielding material is formed by definition of said second layer of conductive material.

Thanks to the present invention, it is possible to obtain a semiconductor memory device comprising both storage memory cells and shielded memory cells, without additional process steps for forming the shielding layer. In fact, the shield is advantageously obtained using the second level of conductive material by means of which the control gate of the storage memory cell is formed.

The features of the present invention will be made apparent by the following detailed description of one embodiment thereof, described as a non-limiting example in the annexed drawings.

DETAILED DESCRIPTION OF THE INVENTION

Figure 1:
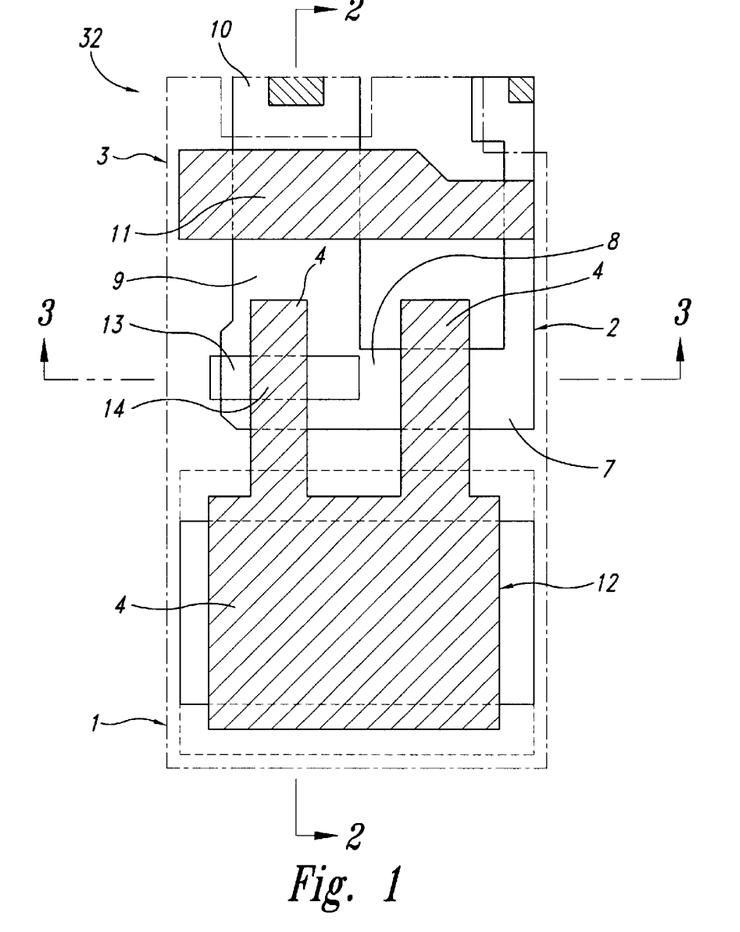
FIG. 1 is a top-plan view of a single polysilicon level EEPROM memory cell.
Figure 2:
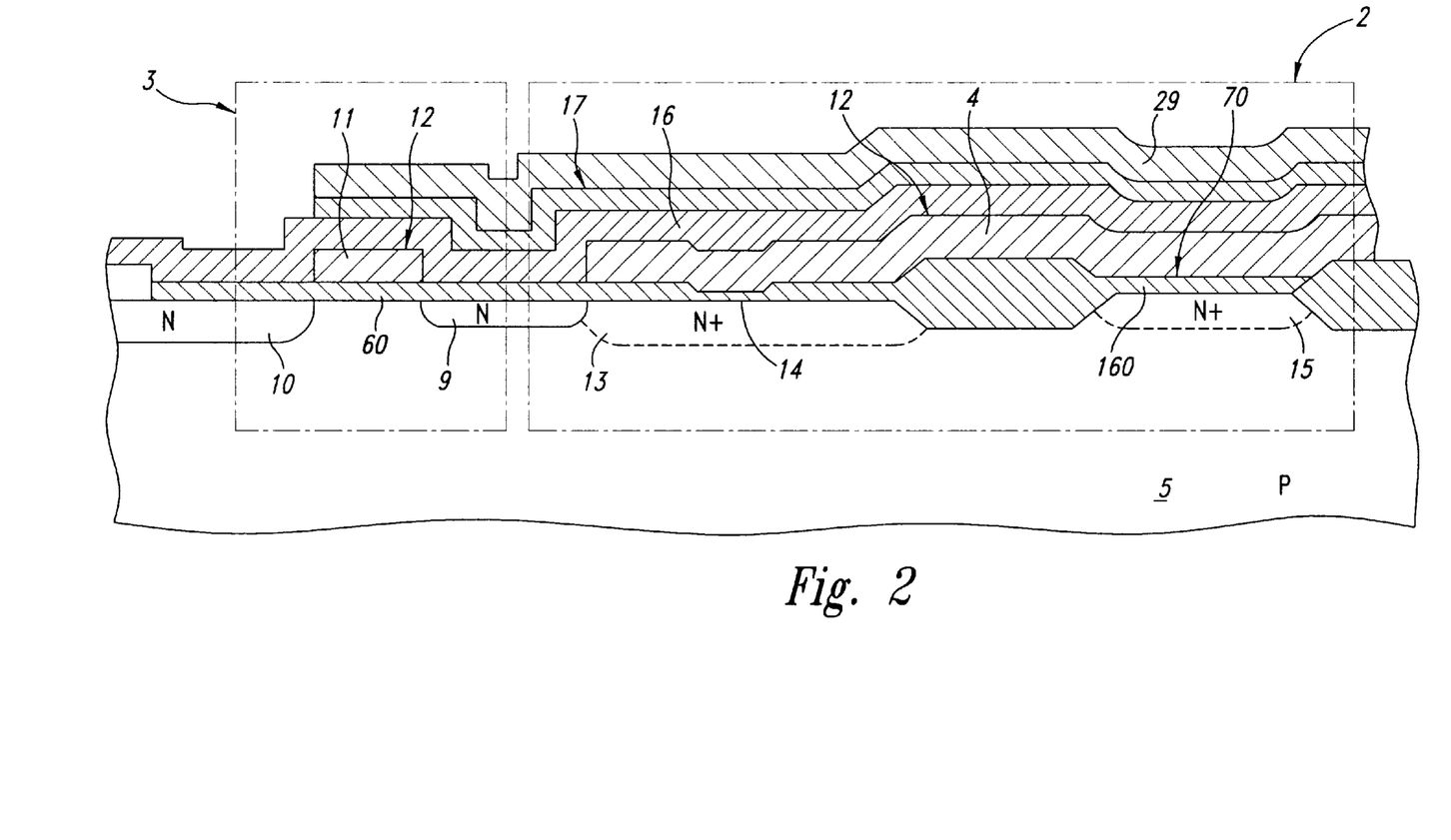
FIG. 2 is a cross sectional view of the single polysilicon level EEPROM cell along line II—II in FIG. 1.
Figure 3:
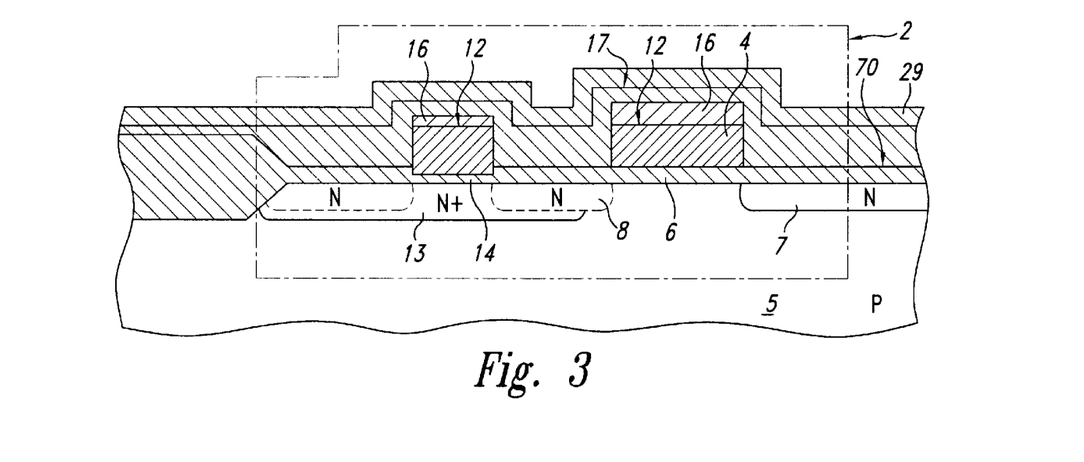
FIG. 3 is a cross sectional view of the single polysilicon level EEPROM cell along line III—III of FIG. 1.

With reference to FIGS. 1 to 3, there is shown a single polysilicon level (SP) FLOTOX EEPROM memory cell 1 comprising a floating-gate sensing transistor 2 and a selection transistor 3 for selecting the cell to be programmed inside a group of cells of a matrix of memory cells. The floating gate 4 of transistor 2 is isolated from a P type substrate 5 by means of a gate oxide layer 6, while source and drain regions 7, 8 of transistor 2 are formed by N type implants in the substrate 5. The selection transistor 3 comprises a source region 9 and a drain region 10, both of type N, separated by a channel region over which there is disposed, with the interposition of a gate oxide layer 60, a gate electrode 11. The floating gate 4 of the sensing transistor 2 and the gate 11 of the selection transistor 3 are formed in a first layer of polysilicon 12. The floating gate 4 of transistor 2 is superimposed over an N+ diffusion 13 formed in substrate 5, so as to be capacitively coupled therewith. Over the diffusion 13 there is disposed a thin oxide 14 called tunnel oxide, that forms the region through which electrons pass during write and erase operations of the cell.

The floating gate 4 of the sensing transistor 2 is also capacitively coupled with an N+ diffusion 15, forming the control gate of the cell, over which there is disposed an oxide layer 160 thicker than the tunnel oxide 14.

Formed over the whole surface of the cell 1 is a layer of intermediate dielectric 16, and the whole cell 1 is then covered by a second polysilicon layer 17, and if desired by a layer of silicide 29, so as to form a shield 32 preventing the information stored in the cell 1 from being accessible from the outside.

In FIG. 1 the region over which the shield 32 sits is indicated by dash-and-dot line.

Figure 4:
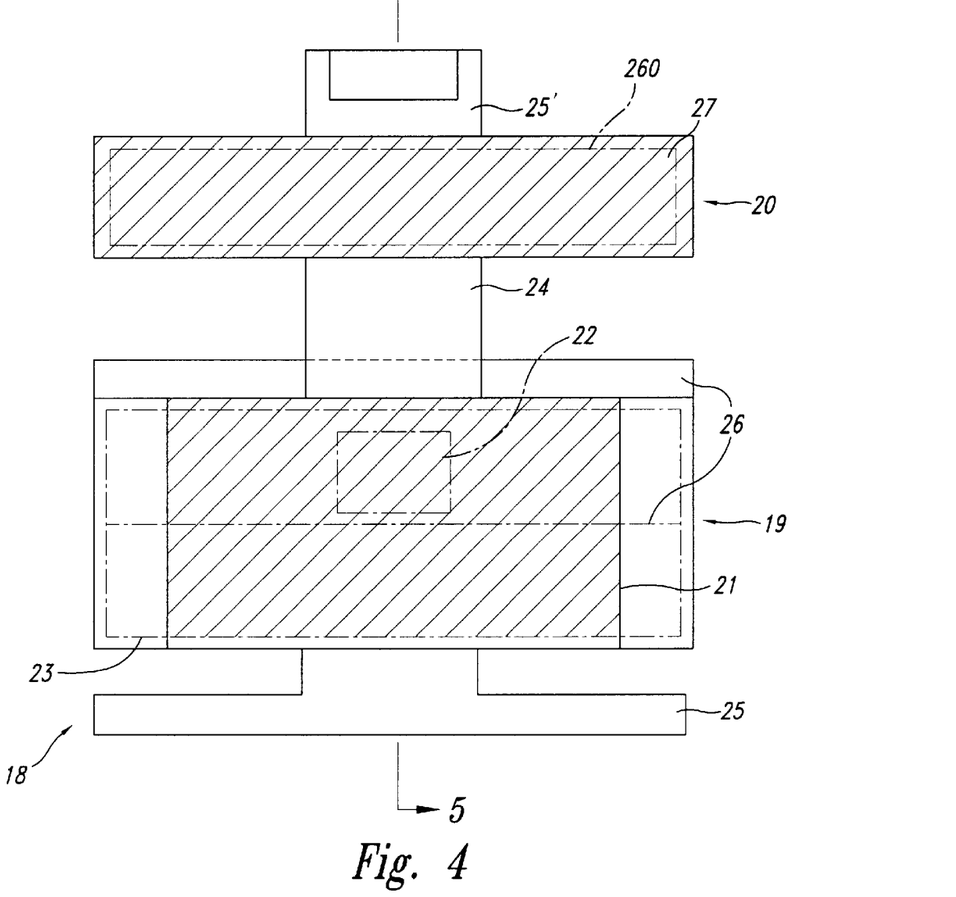
FIG. 4 is a top-plan view of a double polysilicon level EEPROM memory cell.
Figure 5:
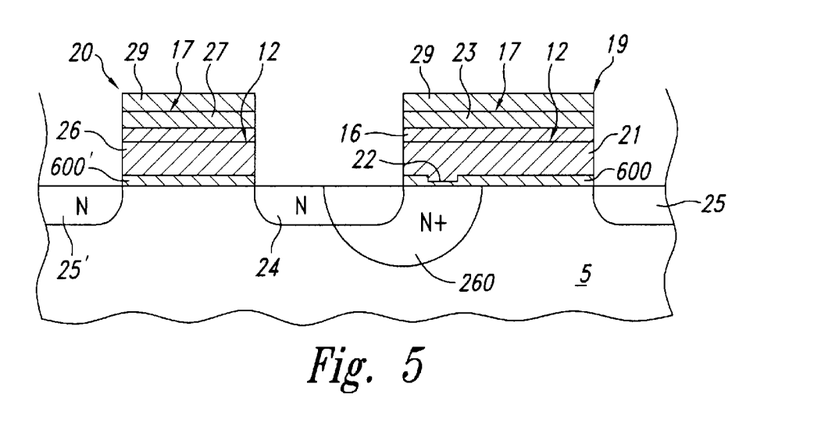
FIG. 5 is a cross sectional view of the double polysilicon level EEPROM cell along line V—V in FIG. 4.

With reference to FIGS. 4 and 5, there is shown a double polysilicon level (DP) FLOTOX EEPROM memory cell 18 formed in the same P type substrate 5 and comprising a floating gate transistor 19 and a selection transistor 20 for selecting the cell to be programmed inside a group of cells of the matrix of memory cells.

The floating gate 21, formed in the first level of polysilicon 12, is formed on a gate oxide layer 600 having a thinner tunnel oxide portion 22 through which electrons pass during write and erase operations of the cell 18. A control gate 23, formed by means of the second level of polysilicon 17, is insulatively disposed above the floating gate 21 with the interposition of the intermediate dielectric layer 16.

Source and drain regions 25, 24 are formed by means of N type dopant implants in the substrate 5. Similarly, an N+ region 260 is formed at the drain 24, extending under the tunnel oxide 22.

The selection transistor 20 comprises an N type source region coincident with the drain region 24 of transistor 19, and a drain region 25' formed in the P type substrate 5. The region of the substrate 5 comprised between the drain region 25' and the source region 24 forms a channel region of transistor 20, over which there is insulatively disposed (by the interposition of a gate oxide layer 600') a gate electrode. Conventionally, the gate electrode comprises two polysilicon electrodes 26, 27 superimposed on each other respectively formed in the first and second level of polysilicon 12, 17 with the interposition of the intermediate dielectric layer 16; electrodes 26, 27 are electrically short-circuited in regions of the matrix not shown in the drawings (short-circuited double polysilicon or "DPCC").

With reference to FIGS. 6 to 13, there are described the steps of a process according to an embodiment of the invention for the simultaneous manufacturing of a single polysilicon level memory cell 1 and a double polysilicon level memory cell 18.

The process steps providing for the formation of the N+ diffusion 15 forming the control gate of the SP EEPROM cell 1 and the N+ region 260 of the DP EEPROM cell 18 are not described in detail because they are conventional.

Figure 6:
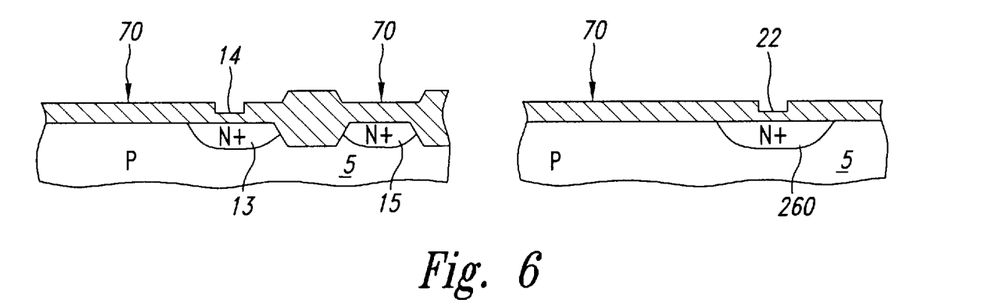
FIGS. 6 to 13 are cross sectional views showing, in vertical section and in time sequence, some steps of a process according to the invention for simultaneously forming double polysilicon level EEPROM cells and single polysilicon level EEPROM cells, the latter shielded by means of a second level of polysilicon.

On the substrate 5 there is grown a gate oxide layer 70 forming the gate oxide 6, 60, 600 and 600' of the transistors of cells 1 and 18, and the gate oxide of the transistor of the circuitry (not shown). Then, using a conventional photolithographic technique, the oxide layer 70 is selectively removed and the tunnel oxide 14, 22 for transistors 2 and 19 of the cells 1 and 18, respectively, is grown (FIG. 6).

Figure 7:
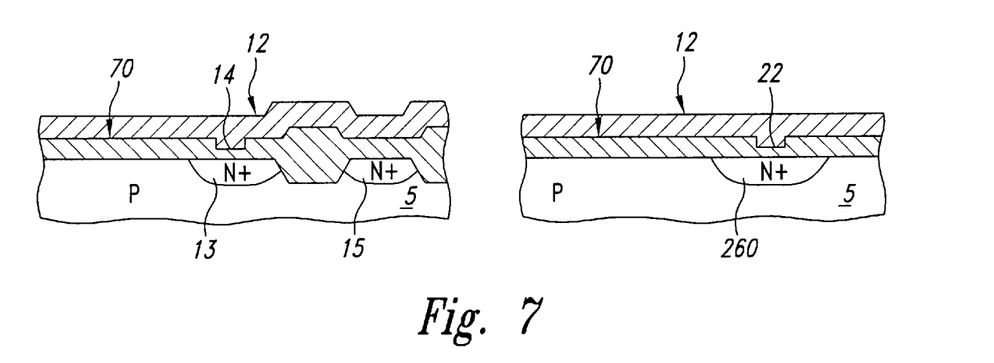

In the following steps of the process the first level of polysilicon 12 is deposited and doped by ion implantation or some other means (FIG. 7).

Figure 8:
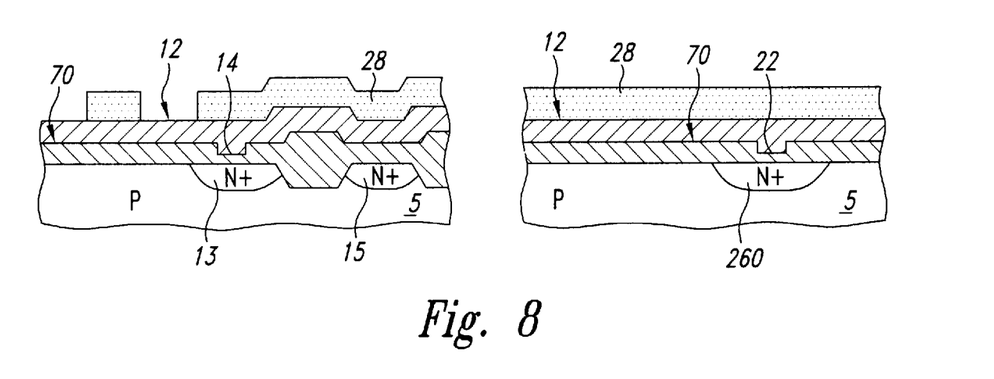
Figure 9:
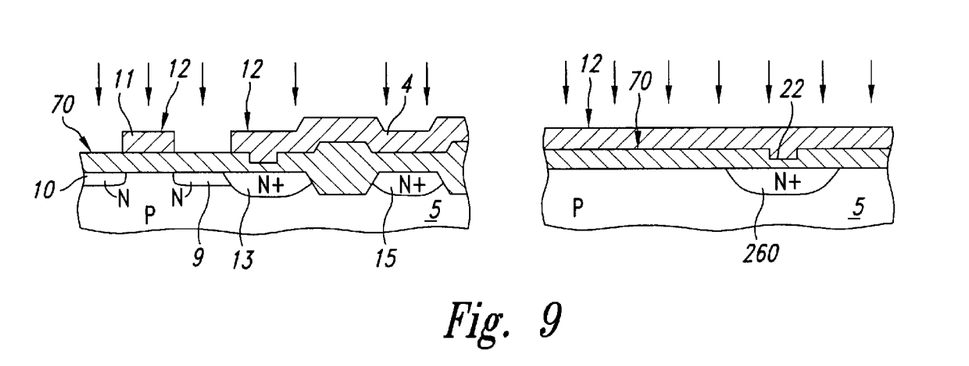
Figure 10:
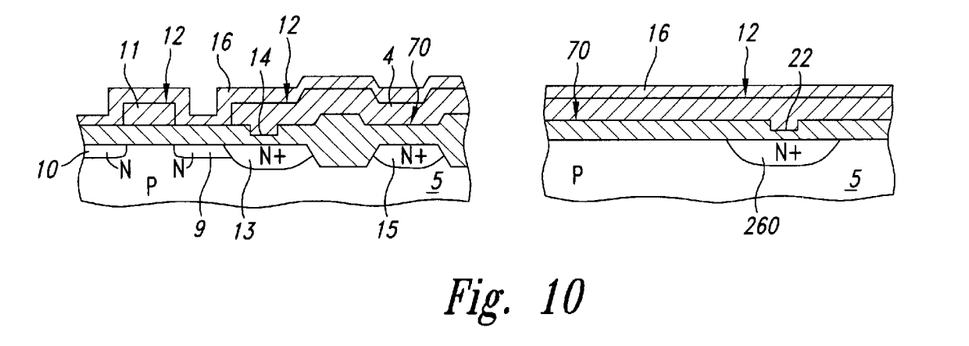

As shown in FIG. 8, using a photolithographic technique providing for the deposition of a photoresist layer 28 and a selective etch thereof, the floating gate 4 of the sensing transistor 2 and the gate 11 of the selection transistor 3 of cell 1 are defined in the first level of polysilicon 12. The first level of polysilicon is not removed from over the cell 18 (FIG. 9).

Still referring to FIG. 9, in the following step the photoresist layer 28 is used to perform an N− implant for forming connecting regions for the sensing transistor 2, and the source 9 and drain 10 of the selection transistor 3 of cell 1. In particular, this step can be accomplished according to the known Lightly Doped Drain (LDD) technique for obtaining regions with low dopant concentration.

The intermediate dielectric layer 16 is then formed over the whole surface of cells 1 and 18 (FIG. 10); conventionally, layer 16 will be removed from the regions where the transistors of the circuitry will be formed.

The second level of polysilicon 17 is then deposited. Preferably, over the second level of polysilicon a layer of silicide 29 is formed (FIG. 11).

Figure 11:
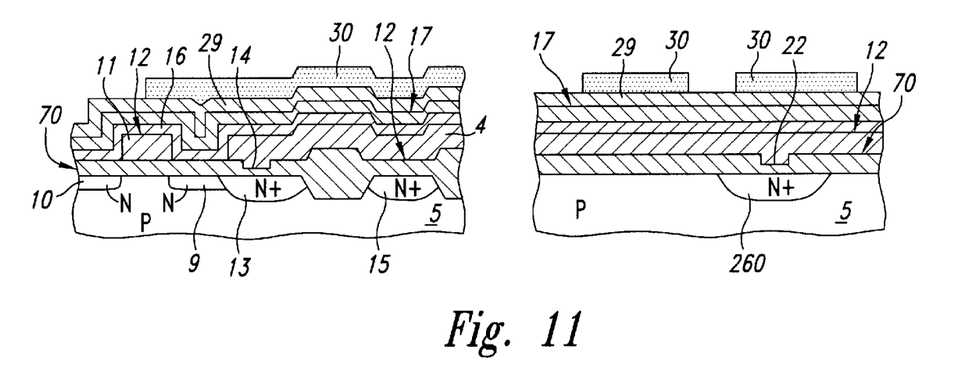

Still referring to FIG. 11, another layer of photoresist 30 is deposited, and layer 30 is selectively removed for forming a mask for the etch of layers 29 and 17. This defines the shield 32 for the SP EEPROM cells 1 and the control gate 23 of cells 18. Obviously, the layout of shield 32 can be designed according to the necessity, provided that the areas wherein drain and source contacts for cells 1 are to be formed are left uncovered. In a preferred embodiment, the shield 32 can be contacted by lines with low resistivity, and biased to reduce the capacitive couplings in the matrix.

Figure 12:
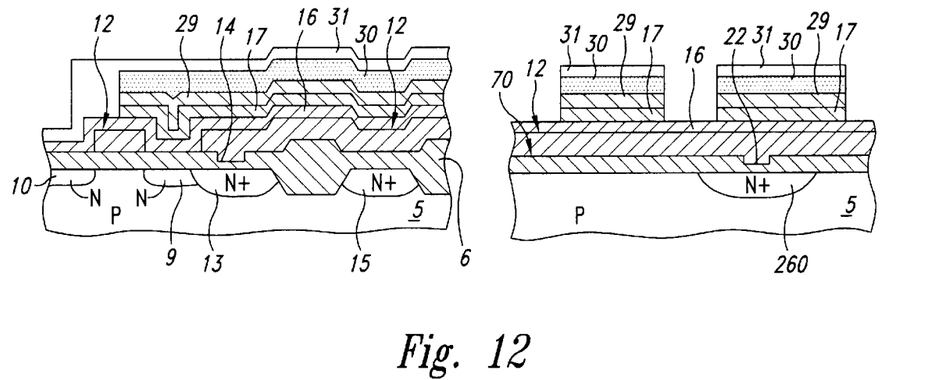
Figure 13:
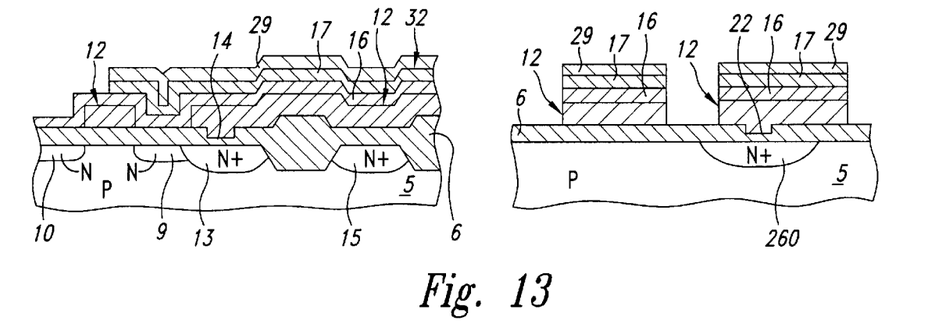

As shown in FIG. 12, using a mask comprising a double layer of photoresist formed by layer 30 and an overlying layer 31, a selective etch of the intermediate dielectric layer 16, the first level of polysilicon 12 and the gate oxide layer 70 for forming the gate of transistors 19 and 20 of cell 18 (FIG. 13).

The following steps conventionally provide for forming spacers 32, performing drain 24 and source 25, 25' implants of cell 18, forming contacts, forming metallization lines, and final passivating the whole matrix.

In the previous description, reference has been made to double level polysilicon EEPROM cells, used to store a large amount of data, and single polysilicon level EEPROM cells shielded by means of the second level of polysilicon for storing reserved information.

However, the present invention is used to produce memory devices having double polysilicon level electrically programmable non-volatile memory cells, of the EPROM, Flash-EEPROM or EEPROM type, and single polysilicon level electrically programmable non-volatile memory cells, of the EPROM, Flash-EEPROM or EEPROM type, in the same semiconductor chip. Over the single polysilicon level cells, a shield is formed by means of the second level of polysilicon for preventing the information stored therein from being accessible from the outside. The modifications to the process previously described are straightforward for the skilled person: for example, in the case both the double polysilicon level cells and the single polysilicon level cells are EPROM cells, it is not necessary to selectively etch the oxide layer 70 and the growth of the tunnel oxides 14, 22, and it is not necessary to implant dopants to form N+ regions 13, 260 under the tunnel oxides.

There is thus obtained a process for forming a semiconductor memory device comprising double polysilicon level storage memory cells and single polysilicon level shielded memory cells, wherein the shield is formed by means of the second level of polysilicon provided for the formation of the double polysilicon level cells.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for manufacturing a semiconductor memory device, comprising:

forming in a semiconductor material chip a first memory cell that includes a first MOS transistor by forming a first gate electrode in a first layer of conductive material and a second gate electrode in a second layer of conductive material superimposed on the first layer of conductive material;

forming in the chip a second memory cell that includes a second MOS transistor having a control gate and a floating gate that are both shielded by a layer of shielding material for preventing information stored in the second memory cell from being accessible from the outside; and wherein said floating gate electrode is formed simultaneously with the first gate electrode of the first memory cell by definition of said first layer of conductive material, and wherein said layer of shielding material is formed by definition of said second layer of conductive material.

2. The process according to claim 1 wherein said first and second layer of conductive material comprise each a layer of polysilicon.

3. The process according to claim 2 wherein said first cell is a double polysilicon level EPROM memory cell.

4. The process according to claim 2 wherein said first cell is a double polysilicon level Flash EEPROM memory cell.

5. The process according to claim 2 wherein said first cell is a double polysilicon level EEPROM memory cell.

6. The process according to claim 2 wherein said second cell is a single polysilicon level EPROM memory cell.

7. The process according to claim 2 wherein said second cell is a single polysilicon level Flash EEPROM memory cell.

8. The process according to claim 2 wherein said second cell is a single polysilicon level EEPROM memory cell.

9. The process according to claim 1 wherein said layer of shielding material has a variable shape.

10. The process according to claim 1 wherein said layer of shielding material is contacted and biased by low-resistance lines.

11. The process of claim 1, further comprising forming a dielectric layer between the shielding layer and the control gate of the second memory cell.

12. The process of claim 1 wherein the step of forming the first memory cell includes:

forming on the chip a first dielectric layer of the first memory cell;

covering the first dielectric layer with the first layer of conductive material;

covering the first layer of conductive material with a second dielectric layer; and forming the shielding layer over the second dielectric layer.

13. The process of claim 1 wherein the control gate of the second memory cell is formed by doping a portion of the semiconductor material chip under the floating gate of the second memory cell.

14. A method for producing a shielded non-volatile memory device comprising the steps of:

forming a first non-volatile memory cell on a semiconductor substrate, the first non-volatile memory cell having a control gate and a floating gate;

forming a second non-volatile memory cell on the semiconductor substrate, the second non-volatile cell having first and second polysilicon gate layers superimposed on one another; and covering the control and floating gates of the first memory cell with a shielding polysilicon layer formed by the second polysilicon gate layer of the second non-volatile memory cell.

15. The method of claim 14 wherein the step of forming a second non-volatile memory cell includes:

forming a tunnel oxide layer on the semiconductor substrate;

covering the tunnel oxide layer with the first polysilicon gate layer of the second non-volatile memory cell;

covering the first polysilicon gate layer of the second non-volatile memory cell with an intermediate dielectric layer; and forming the second polysilicon gate layer of the second non-volatile memory cell over the intermediate dielectric layer.

16. The method of claim 14 wherein the step of forming a second non-volatile memory cell includes:

forming a first dielectric layer on the semiconductor substrate;

covering the first dielectric layer with the first polysilicon gate layer of the second non-volatile memory cell;

covering the first polysilicon gate layer of the second non-volatile memory cell with a second dielectric layer; and forming the second polysilicon gate layer of the second non-volatile memory cell over the second dielectric layer.

17. The method of claim 14 wherein the control gate of the first memory cell is formed by doping a portion of the semiconductor material chip under the floating gate of the first memory cell.

18. The method of claim 14, further comprising forming a dielectric layer between the shielding polysilicon layer and the control gate of the first memory cell.

19. A process for forming a semiconductor memory device comprising:
- on a semiconductor substrate, forming a dielectric layer for a non-volatile first memory cell and a non-volatile second memory cell;
- forming a gate layer on the dielectric layer for the first and second memory cells;
- covering the gate layer with an intermediate insulating layer for the first and second memory cells;
- forming a floating gate of the first memory cell from the gate layer;
- forming a control gate of the first memory cell, the control gate being capacitively coupled to the floating gate;
- after forming the control gate of the first memory cell, forming a shielding layer on a portion of the intermediate insulating layer for the first memory cell using a conductive layer; and
- forming a control gate on a portion of the intermediate insulating layer for the second memory cell using the conductive layer.

20. The method of claim 19 wherein the step of forming a gate layer includes depositing a polysilicon layer on the dielectric layer.

21. The method of claim 19 wherein the steps of forming a shielding layer and forming a control gate for the second memory cell are performed simultaneously.

22. The method of claim 21 wherein the conductive layer includes a polysilicon layer that is deposited on the intermediate insulating layer and defined to separate the shielding layer from the control gate of the second memory cell.

* * * * *